(12) United States Patent
Xue et al.

(10) Patent No.: US 11,374,165 B2
(45) Date of Patent: Jun. 28, 2022

(54) METHOD OF FORMING ULTRA-SMOOTH BOTTOM ELECTRODE SURFACE FOR DEPOSITING MAGNETIC TUNNEL JUNCTIONS

(71) Applicant: Applied Materials, Inc., Santa Clara, CA (US)

(72) Inventors: Lin Xue, San Diego, CA (US); Sajjad Amin Hassan, Fremont, CA (US); Mahendra Pakala, Santa Clara, CA (US); Jaesoo Ahn, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 68 days.

(21) Appl. No.: 16/810,697

(22) Filed: Mar. 5, 2020

(65) Prior Publication Data

US 2020/0203600 A1  Jun. 25, 2020

Related U.S. Application Data

(62) Division of application No. 15/712,185, filed on Sep. 22, 2017, now Pat. No. 10,586,914.

(Continued)

(51) Int. Cl.
*H01L 43/02* (2006.01)
*H01L 27/22* (2006.01)
(Continued)

(52) U.S. Cl.
CPC ............ *H01L 43/02* (2013.01); *H01L 27/222* (2013.01); *H01L 43/08* (2013.01); *H01L 43/12* (2013.01)

(58) Field of Classification Search
None
See application file for complete search history.

(56) References Cited

U.S. PATENT DOCUMENTS 5,734,605 A   3/1998  Zhu et al.
6,174,737 B1  1/2001  Durlam et al.
(Continued)

FOREIGN PATENT DOCUMENTS

JP   2005109477 A   4/2005
JP   2013/512585 A  4/2013
(Continued)

OTHER PUBLICATIONS

Japanese Office Action dated Aug. 25, 2020 for Application No. 2019-520034.
(Continued)

*Primary Examiner* — Long Pham
(74) *Attorney, Agent, or Firm* — Patterson + Sheridan, LLP

(57) ABSTRACT

A process sequence is provided to provide an ultra-smooth (0.2 nm or less) bottom electrode surface for depositing magnetic tunnel junctions thereon. In one embodiment, the sequence includes forming a bottom electrode pad through bulk layer deposition followed by patterning and etching. Oxide is then deposited over the formed bottom electrode pads and polished back to expose the bottom electrode pads. A bottom electrode buff layer is then deposited thereover following a pre-clean operation. The bottom electrode buff layer is then exposed to a chemical mechanical polishing process to improve surface roughness. An magnetic tunnel junction deposition is then performed over the bottom electrode buff layer.

20 Claims, 3 Drawing Sheets

US 11,374,165 B2
Page 2

Related U.S. Application Data

(60) Provisional application No. 62/408,309, filed on Oct. 14, 2016.

(51) Int. Cl.
  *H01L 43/08* (2006.01)
  *H01L 43/12* (2006.01)

(56) References Cited

U.S. PATENT DOCUMENTS

| | | | |
|---|---|---|---|
| 6,386,950 B1 | 5/2002 | Jacquinot et al. | |
| 6,531,777 B1 | 3/2003 | Woo et al. | |
| 6,582,761 B1 | 6/2003 | Nishimoto et al. | |
| 6,592,776 B1 | 7/2003 | Wang et al. | |
| 6,633,083 B2 | 10/2003 | Woo et al. | |
| 7,144,744 B2 | 12/2006 | Lien et al. | |
| 8,252,687 B2 | 8/2012 | Li et al. | |
| 8,644,063 B2 | 2/2014 | Li et al. | |
| 8,883,520 B2 * | 11/2014 | Satoh | H01L 43/12 438/3 |
| 9,142,762 B1 | 9/2015 | Li et al. | |
| 9,373,663 B2 | 6/2016 | Satoh et al. | |
| 2006/0249482 A1 | 11/2006 | Wrschka et al. | |
| 2007/0181534 A1 | 8/2007 | Kamimura | |
| 2009/0224200 A1 | 9/2009 | Jha et al. | |
| 2009/0246956 A1 | 10/2009 | Takamiya et al. | |
| 2010/0075502 A1 | 3/2010 | Li et al. | |
| 2010/0289098 A1 | 11/2010 | Li et al. | |
| 2011/0129946 A1 | 6/2011 | Zhong et al. | |
| 2013/0009310 A1 | 1/2013 | Sapra et al. | |
| 2013/0095656 A1 | 4/2013 | Matsui et al. | |
| 2013/0244344 A1 | 9/2013 | Malmhall et al. | |
| 2015/0084140 A1 | 3/2015 | Satoh et al. | |
| 2015/0311427 A1 | 10/2015 | Gottwald et al. | |
| 2016/0218280 A1 | 7/2016 | Park et al. | |
| 2017/0092846 A1 | 3/2017 | Doyle et al. | |

FOREIGN PATENT DOCUMENTS

| | | | |
|---|---|---|---|
| JP | 2017516303 A | 6/2017 | |
| TW | 201614881 A | 4/2016 | |
| WO | 2010051010 A1 | 5/2010 | |
| WO | 2015167718 A1 | 11/2015 | |

OTHER PUBLICATIONS

European Office Action dated Jan. 25, 2021 for application No. 17859977.5.
H. Honjo et al., "10nm perpendicular-anisotropy CoFeB—MgO magnetic tunnel junction with over 400C high thermal tolerance by boron diffusion control", Symposium on VLSI Technology Digest of Technical Papers.
Japanese Office Action—Decision to Grant dated Jun. 8, 2021 for Application No. 2019-520034.
Korean Office Action dated Jul. 31, 2020 for Application No. 10-2019-7013822.
European Search Report dated May 4, 2020 for Application No. 17859975.
International Search Report and Written Opinion dated Jan. 10, 2018 for Application No. PCT/US2017/053170.
Taiwan Office Action dated May 7, 2019 for Application No. 106135059.
Japanese Office Action dated Feb. 9, 2021, for Application No. 2019-520034.
Taiwan Office Action dated Dec. 9, 2020 for Application No. 109102976.
Taiwan Office Action for Taiwan Patent Application No. 110133371 dated Feb. 16, 2022.

* cited by examiner

METHOD OF FORMING ULTRA-SMOOTH BOTTOM ELECTRODE SURFACE FOR DEPOSITING MAGNETIC TUNNEL JUNCTIONS

CROSS-REFERENCE TO RELATED APPLICATIONS

This application is a divisional of pending U.S. patent application Ser. No. 15/712,185, filed Sep. 22, 2017, which claims the benefit of U.S. Provisional Patent Application Ser. No. 62/408,309, filed on Oct. 14, 2016. Each of the patent applications are herein incorporated by reference in their entirety.

BACKGROUND

Field

Embodiments disclosed herein relate to forming magnetic tunnel junctions, and more specifically to forming ultra-smooth bottom electrode surfaces for depositing magnetic tunnel junctions thereon.

Description of the Related Art

Magnetic tunnel junction (MTJ) stacks are typically deposited over bottom electrodes. Conventional sequences include forming bottom electrodes over bottom vias using a damascene process. Oxide is deposited over the bottom vias and then patterned to form openings for the bottom electrodes. Metal is then deposited in the openings to form the bottom electrodes. Chemical Mechanical Polishing (CMP) is used to polish the upper surface of the bottom electrodes back to the upper surface of the oxide. A bottom electrode touch-up layer is then deposited over the bottom electrode and oxide and polished.

One problem with the damascene process is that a step is formed when polishing the bottom electrode material using CMP. This step at the interface of the oxide and the bottom electrode is detrimental to the performance of the MTJ. Additionally, the bottom electrode touch-up layer must be deposited at a greater thickness than desired to accommodate the difficulty in controlling CMP of that layer. This increased thickness of the bottom electrode touch-up layer additionally adversely affects the etching process used to form the MTJs. Still further, the increased thickness of the bottom electrode touch-up layer requires that the MTJ size needs to be bigger than the bottom electrode pad to avoid excessive exposure of the bottom electrode material during an MTJ etch.

Therefore, there is a need for a process to form an ultra-smooth bottom electrode surface for depositing MTJs thereon.

SUMMARY

A process sequence is provided to provide an ultra-smooth (0.2 nanometers (nm) or less) bottom electrode surface for depositing magnetic tunnel junctions thereon. In one embodiment, the sequence includes forming a bottom electrode pad through bulk layer deposition followed by patterning and etching. Oxide is then deposited over the formed bottom electrode pads and polished back to expose the bottom electrode pads. A bottom electrode buff layer is then deposited thereover following a pre-clean operation. The bottom electrode buff layer is then exposed to a CMP process to improve surface roughness. An MTJ deposition is then performed over the bottom electrode buff layer.

In another embodiment, a method of forming an MTJ structure, wherein an MTJ structure size is less than, equal to or greater than a size of a bottom electrode pad, is disclosed.

In yet another embodiment, a structure is disclosed which includes a substrate having a plurality of conductive vias thereon, a plurality of bottom electrode pads disposed over the plurality of conductive vias, a dielectric material disposed between the plurality of bottom electrode pads, a bottom electrode buff layer disposed over the plurality of bottom electrode pads and the dielectric material and a plurality of MTJ structures disposed over one or more of the plurality of bottom electrode pads.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective aspects.

To facilitate understanding, identical reference numerals have been used, where possible, to designate identical elements that are common to the figures. It is contemplated that elements and features of one aspect may be beneficially incorporated in other embodiments without further recitation.

DETAILED DESCRIPTION

A process sequence is provided to provide an ultra-smooth (0.2 nm or less) bottom electrode surface for depositing magnetic tunnel junctions thereon. In one embodiment, the sequence includes forming a bottom electrode pad through bulk layer deposition followed by patterning and etching. Oxide is then deposited over the formed bottom electrode pads and polished back to expose the bottom electrode pads. A bottom electrode buff layer is then deposited thereover following a pre-clean operation. The bottom electrode buff layer is then exposed to a CMP process to improve surface roughness. An MTJ deposition is then performed over the bottom electrode buff layer.

Figure 1:
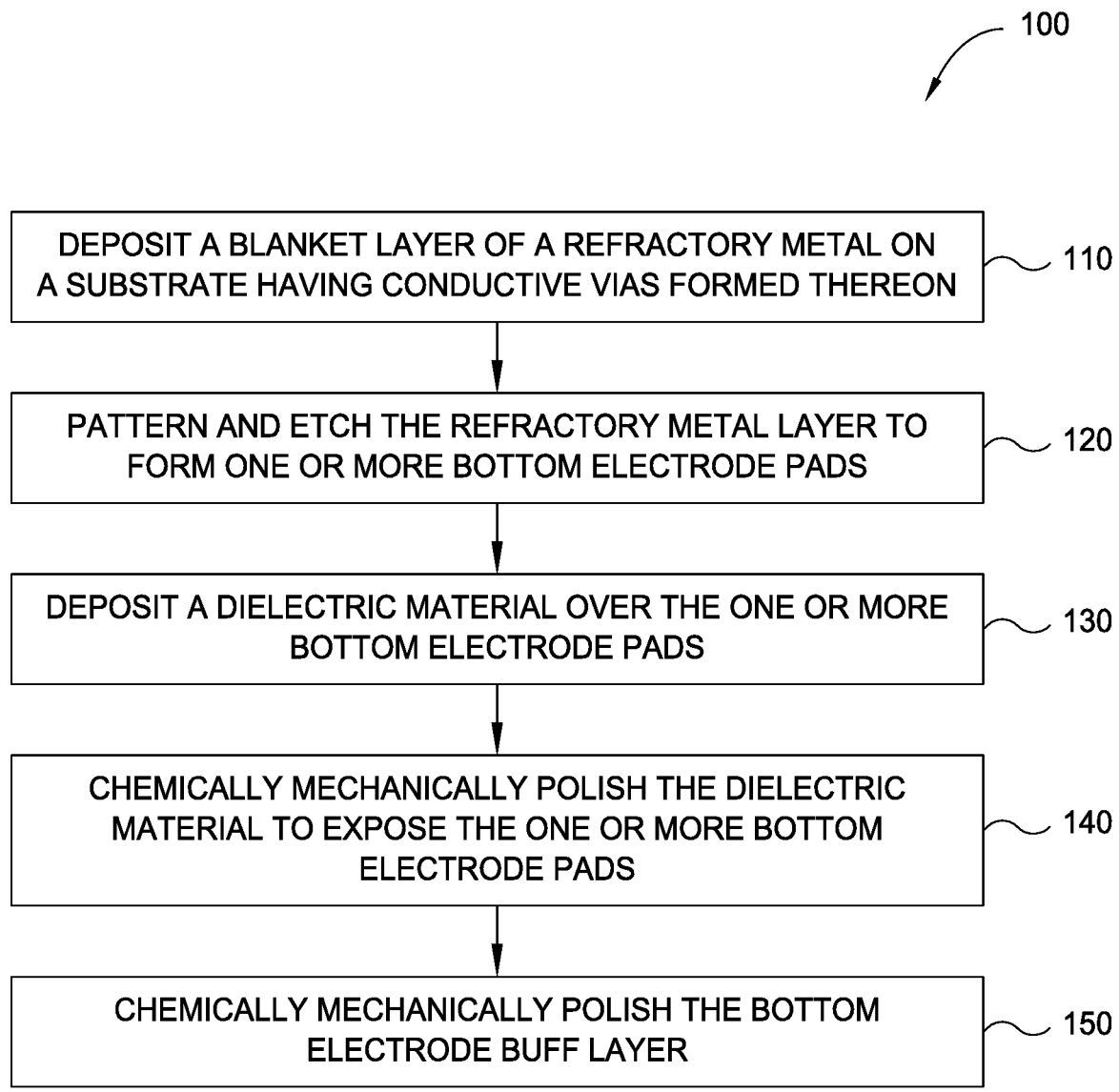
FIG. 1 is a process flow of bottom electrode formation for MTJ deposition.

In one embodiment, a process flow 100 for forming a bottom electrode having an ultra-smooth bottom electrode surface is provided and shown in FIG. 1. The process flow 100 begins with depositing a blanket layer of a refractory metal on a substrate having conductive vias formed thereon at operation 110. Next, operation 120 includes patterning and etching the refractory metal layer to form one or more bottom electrode pads. A dielectric material is then deposited over the one or more bottom electrode pads at operation 130. The dielectric material is chemically mechanically polished to expose the one or more bottom electrode pads at operation 140. At operation 150, a bottom electrode buff layer is deposited over the dielectric material and the exposed one or more bottom electrode pads. Finally, at operation 160, the bottom electrode buff layer is chemically mechanically polished.

Figure 2:
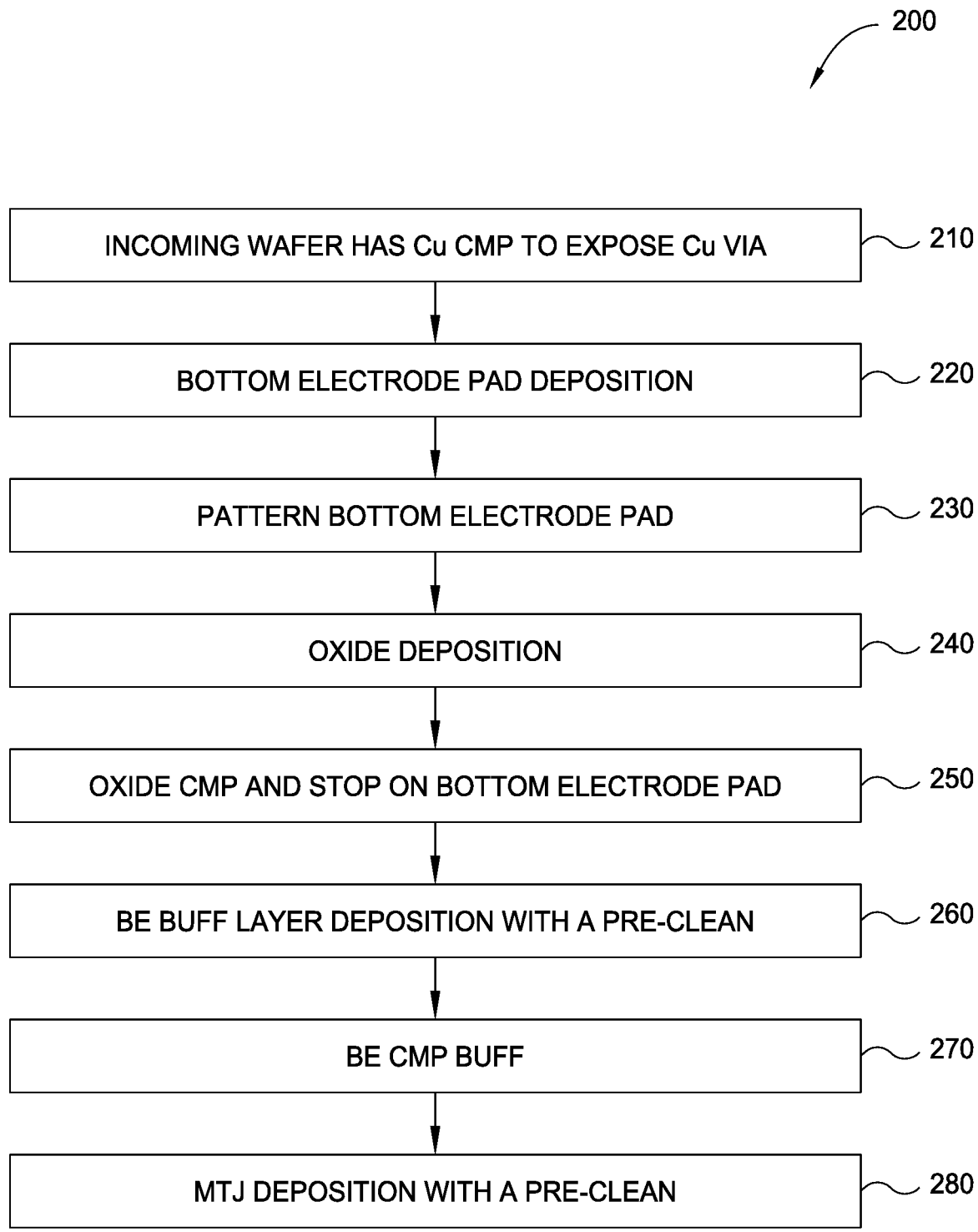
FIG. 2 is another process flow of bottom electrode formation for MTJ deposition.

In another embodiment, a process flow 200 for forming a bottom electrode having an ultra-smooth bottom electrode surface is provided and shown in FIG. 2. At operation 210, an incoming substrate having vias of copper or other conductive material formed thereon is introduced into the process flow. A blanket deposition of conductive material, such as a refractory metal or metal nitride, is formed over the copper vias at operation 220. The refractory metal or metal nitride can be selected from tantalum, tantalum nitride, tungsten, tungsten nitride or combinations thereof. Other metals or metal nitrides such as titanium or titanium nitride can be deposited and capped with refractory metals or metal nitrides. At operation 230, the blanket layer is then patterned and etched to form the bottom electrode pads. Oxide, or another dielectric material, is then deposited over the bottom electrodes at operation 240. Following oxide deposition, the oxide is polished using CMP to stop on the bottom electrodes at operation 250. A bottom electrode buff layer of conductive material, such as a refractory metal or metal nitride, is then deposited on the exposed bottom electrode pad and oxide following a pre-clean operation at operation 260. The refractory metal or metal nitride can be selected from tantalum, tantalum nitride, tungsten, tungsten nitride or combinations thereof. Then, at operation 270, the bottom electrode buff layer is polished using CMP to increase uniformity across the bottom electrode pad surface(s) and reduce asperities coming from the bottom of the structure. An MTJ deposition sequence is then performed to form MTJ stacks thereover at operation 280.

The methods of forming a magnetic tunnel junction (MTJ) structure disclosed herein provide for formation of an MTJ structure in which the MTJ size is less than, equal to or greater than a size of a bottom electrode pad.

Figure 3:
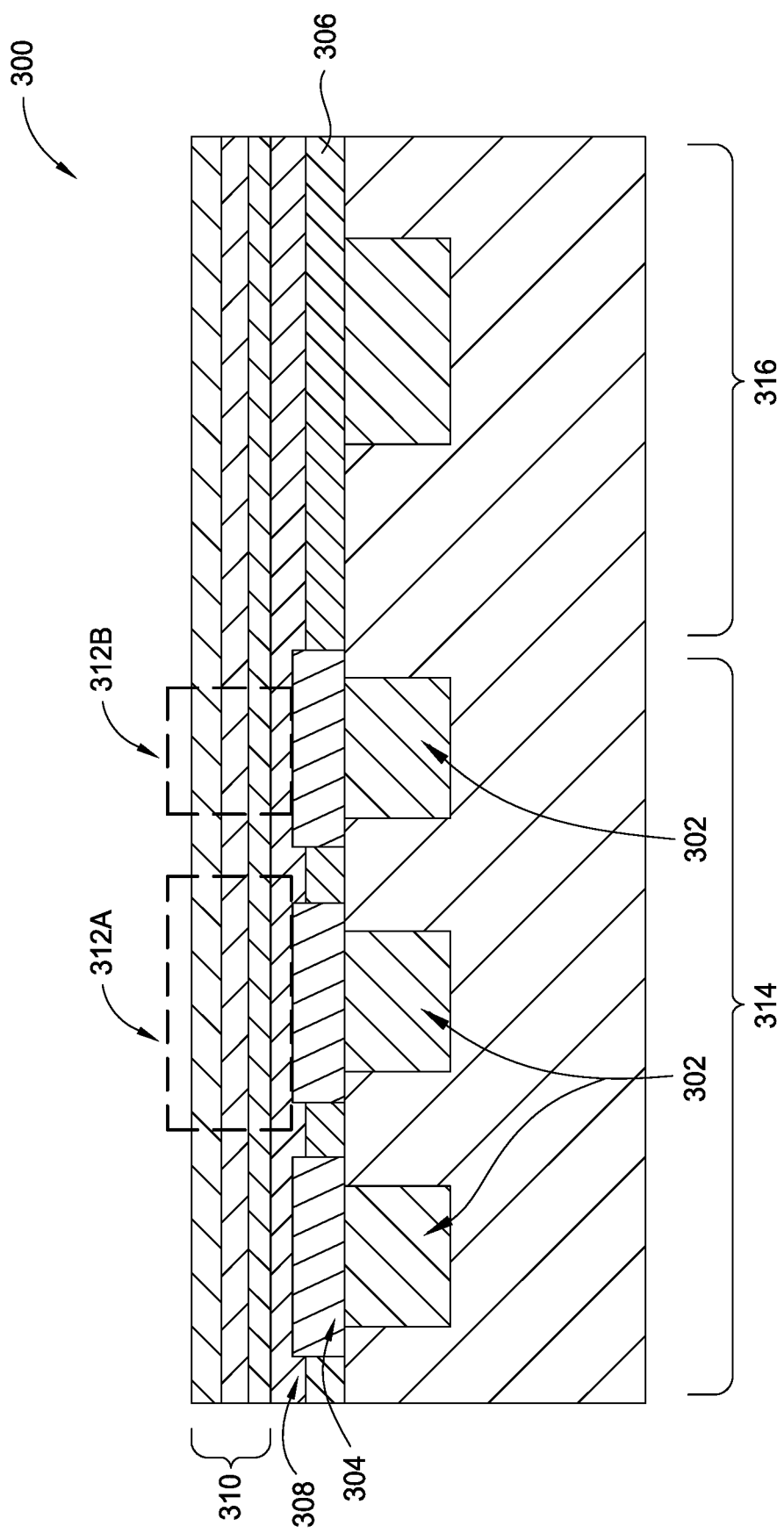
FIG. 3 is a cross-sectional view of a structure formed according to an embodiment of a process sequence disclosed herein.

FIG. 3 is a cross-sectional view illustrating a structure 300, such as a memory device having a memory portion 314 and a logic portion 316, formed according to an embodiment of a process sequence disclosed herein. One example of a process sequence of this disclosure includes the deposition of tantalum nitride as the bottom electrode pad 304 and the bottom electrode buff layer 308 over a substrate having vias 302 of conductive material thereon. The tantalum nitride is preferably deposited using physical vapor deposition. Nitrogen gas flows can be adjusted to achieve a stoichiometry approaching 1:1. This desired stoichiometry can be achieved, for example, by increasing nitrogen flow during physical vapor deposition. As one example, a tantalum nitride layer can be deposited by reactive sputtering of a tantalum target with nitrogen gas flow. An exemplary deposition system that can be used is the EnCoRe II Ta(N) chamber on an Endura® processing platform, available from Applied Materials, Inc. located in Santa Clara, Calif. The as deposited surface roughness has been shown to improve as the stoichiometry approaches 1:1. For example, a surface roughness below about 0.75 nm as deposited can be achieved as the stoichiometry approaches 1:1. The surface roughness of the tantalum nitride layer can be improved using a low down force CMP process. For example, a surface roughness of less than 0.2 nm can be achieved following a CMP process in which about 1 pound per square inch (psi) down force is applied. CMP processes from low down force of about 1 psi up to a high down force of about 3 psi can achieve good results. A CMP process according to aspects disclosed herein can be performed using a Ceria based slurry on a Reflexion® LK Prime processing system, available from Applied Materials, Inc. located in Santa Clara, Calif.

In addition, the resistance of tantalum nitride having a stoichiometry approaching 1:1 displays lower resistance between about 6 to 7 ohms/sq. In addition, the MTJ stack 310 deposited on the tantalum nitride layer displays a higher tunnel magnetoresistance (TMR) than MTJ stacks deposited on a tantalum nitride layer with a lower stoichiometric ratio.

In the sequence shown in FIG. 2, a blanket tantalum nitride layer is deposited and then patterned and etched to form the bottom electrode pad 304. The tantalum nitride etch can be performed using chlorine ($Cl_2$) based etch chemistry on an AdvantEdge Mesa chamber on a Centura® platform, available from Applied Materials, Inc. located in Santa Clara, Calif. Oxide 306, such as silicon oxide, or another dielectric material, is then deposited over the formed bottom electrode pads 304 and polished using a high down force CMP process, for example about three psi. The silicon oxide can be deposited using a tetraethyl orthosilicate (TEOS) based or silane based chemistry on a Producer® PECVD system, available from Applied Materials, Inc. located in Santa Clara, Calif. An oxide to tantalum nitride selectivity of over 100:1 is achieved for both high and low down force CMP processes using Ceria-based slurry. To improve throughput, high down force such as three psi can be used to polish back the oxide 306 to the bottom electrode pad 304. The selectivity provides a predictable stop on the bottom electrode pad resulting in less dishing or step formation. Polishing head down force pressures of from 0.1 psi to five psi can be used for oxide removal. A removal rate of 1500 Å/min. or greater is desirable to improve throughput.

Following the CMP process to remove excess oxide and expose the bottom electrode pads 304, a tantalum nitride bottom electrode buff layer 308 is then deposited following a pre-clean operation. A pre-clean operation such as an argon (Ar) based plasma process can be performed on a PC XT chamber on an Endura® platform, available from Applied Materials, Inc. located in Santa Clara, Calif. The bottom electrode buff layer 308 can be deposited to a thickness of between about 2 and about 10 nm. Once the bottom electrode buff layer 308 is deposited, it is subjected to a CMP process to remove any asperities (sharp features or other discontinuities) on the surface thereof. CMP process is preferably a low down force CMP process of about 1 psi or less performed using a Ceria based slurry on a Reflexion® LK Prime processing system. A head rotation of between about 10 RPM and about 300 RPM and a platen rotation of between about 10 RPM and about 300 RPM can be used to achieve asymmetry performance as well as planarization. Pad conditioning may be performed to provide rate stability and good defect (scratch) performance at 2-11 lbs. Slurry flow, for cost-of-consumables (CoC) as well as an initial rate boost, of between about 50 ml/min to about 500 ml/min. can be used. Pad/Wafer rinse can be performed for defect reduction for between about 10 sec. to about 120 sec. An MTJ stack 310 is then deposited over the bottom electrode pads 304 and bottom electrode buff layer 308 and further processed to form one or more MTJ devices (two are shown as 312A, 312B) over the bottom electrodes pads 304.

Accordingly, the structure 300 includes a substrate having a plurality of conductive vias 302 thereon, a plurality of bottom electrode pads 304 disposed over the plurality of conductive vias 302, an oxide 306, or other dielectric material, disposed between the plurality of bottom electrode pads 304, a bottom electrode buff layer 308 disposed over the plurality of bottom electrode pads 304 and the oxide 306, and a plurality of MTJ structures 312A,312B disposed over one or more of the plurality of bottom electrode pads 304, as shown in FIG. 3. A size of each of the MTJ structures can be greater than, equal to or less than a size of each of the bottom electrode pads 304. As shown in FIG. 3, the first MTJ structure 312A is larger than the bottom electrode pad 304, and the second MTJ structure 312B is smaller than the bottom electrode pad 304.

It has been found that the low down force CMP process performed on the bottom electrode buff layer provides improved surface roughness of 0.2 nm or less. Preferably the removal rate for the low down force CMP process is less than 500 angstroms per minute (A/min). MTJ devices formed on a bottom electrode buff layer which has been polished using a low down force CMP process have a 75% higher coercivity (Oe) and a relatively higher tunneling magnetoresistance (TMR) than devices formed without using the CMP process on the bottom electrode buff layer disclosed herein. In addition, better device performance has been demonstrated with better MTJ film smoothness. MTJ film smoothness results, at least partially, from a low surface roughness bottom electrode buff layer as disclosed herein. In addition, the ability to deposit a thin, less than 10 nm, bottom electrode buff layer enables the formation of an MTJ size that can be less than, greater than or equal to the bottom electrode pad size.

While the foregoing is directed to embodiments of the present disclosure, other and further embodiments of the disclosure may be devised without departing from the basic scope thereof, and the scope thereof is determined by the claims that follow.

The invention claimed is:

1. A structure, comprising:
a substrate having a plurality of conductive vias thereon;
a plurality of bottom electrode pads disposed over the plurality of conductive vias;
a dielectric material disposed between the plurality of bottom electrode pads;
a bottom electrode buff layer comprising tantalum nitride is disposed over the plurality of bottom electrode pads and the dielectric material; and
a plurality of magnetic tunnel junction (MTJ) structures disposed over one or more of the plurality of bottom electrode pads.

2. The structure of claim 1, wherein a surface roughness of the bottom electrode buff layer is less than 0.2 nm.

3. The structure of claim 1, wherein a thickness of the bottom electrode buff layer is about 2 nm to about 10 nm.

4. The structure of claim 1, wherein a size of at least one of the MTJ structures is less than a size of at least one of the bottom electrode pads.

5. The structure of claim 1, wherein a size of at least one of the MTJ structures is greater than a size of at least one of the bottom electrode pads.

6. The structure of claim 1, wherein a size of at least one of the MTJ structures is equal to a size of at least one of the bottom electrode pads.

7. The structure of claim 1, wherein the tantalum nitride of the bottom electrode buff layer has a resistance of about 6 ohms/sq to about 7 ohms/sq.

8. The structure of claim 1, wherein a size of at least one of the bottom electrode pads is less than, equal to, or greater than a size of at least one of the conductive vias.

9. A structure, comprising:
a substrate having a plurality of conductive vias thereon;
a plurality of bottom electrode pads disposed over the plurality of conductive vias;
a dielectric material disposed between the plurality of bottom electrode pads;
a bottom electrode buff layer comprising tantalum nitride is disposed over the plurality of bottom electrode pads and the dielectric material; and
a plurality of magnetic tunnel junction (MTJ) structures disposed over one or more of the plurality of bottom electrode pads, wherein a size of at least one of the MTJ structures is less than a size of at least one of the bottom electrode pads and a size of at least one of the MTJ structures is greater than a size of at least one of the bottom electrode pads.

10. The structure of claim 9, wherein a surface roughness of the bottom electrode buff layer is less than 0.2 nm.

11. The structure of claim 9, wherein a thickness of the bottom electrode buff layer is about 2 nm to about 10 nm.

12. The structure of claim 9, wherein the tantalum nitride of the bottom electrode buff layer has a resistance of about 6 ohms/sg to about 7 ohms/sq.

13. The structure of claim 9, wherein a size of at least one of the plurality of bottom electrode pads is less than, equal to, or greater than a size of at least one of the plurality of conductive vias.

14. The structure of claim 9, wherein the plurality of bottom electrode pads comprises tantalum, tantalum nitride, tungsten, tungsten nitride, or combinations thereof.

15. A structure, comprising:
a substrate having a plurality of conductive vias thereon;
a first bottom electrode pad disposed over at least one of the plurality of conductive vias;
a second bottom electrode pad disposed over at least one of the plurality of conductive vias;
a dielectric material disposed between the first bottom electrode pad and the second bottom electrode pad;
a bottom electrode buff layer comprising tantalum nitride is disposed over the first bottom electrode pad, the second bottom electrode pad, and the dielectric material;
a first magnetic tunnel junction (MTJ) structure disposed over the first bottom electrode pad, wherein the first MTJ structure size is larger than a size of the first bottom pad; and
a second MTJ structure disposed over the second bottom electrode pad, wherein the second MTJ structure size is smaller than a size of the second bottom electrode pad.

16. The structure of claim 15, wherein a surface roughness of the bottom electrode buff layer is less than 0.2 nm.

17. The structure of claim 15, wherein a thickness of the bottom electrode buff layer is about 2 nm to about 10 nm.

18. The structure of claim 15, wherein the tantalum nitride of the bottom electrode buff layer has a resistance of about 6 ohms/sq to about 7 ohms/sq.

19. The structure of claim 15, wherein a size of at least one of the first bottom electrode pad or the second bottom electrode pad is less than, equal to, or greater than a size of at least one of the plurality of conductive vias.

20. The structure of claim 15, wherein each of the first and second bottom electrode pads independently comprises tantalum, tantalum nitride, tungsten, tungsten nitride, or combinations thereof.

* * * * *